(12) United States Patent
Ollivier et al.

(10) Patent No.: US 7,740,725 B2
(45) Date of Patent: Jun. 22, 2010

(54) THICK FILM CONDUCTOR PASTE COMPOSITION FOR LTCC TAPE IN MICROWAVE APPLICATIONS

(75) Inventors: Patricia J. Ollivier, Raleigh, NC (US); Kenneth Warren Hang, Hillsborough, NC (US)

(73) Assignee: E.I. Du Pont De Nemours and Company, Wilmington, DE (US)

( * ) Notice: Subject to any disclaimer, the term of this patent is extended or adjusted under 35 U.S.C. 154(b) by 114 days.

(21) Appl. No.: 11/999,835

(22) Filed: Dec. 7, 2007

(65) Prior Publication Data

US 2008/0090051 A1 Apr. 17, 2008

Related U.S. Application Data

(62) Division of application No. 11/398,141, filed on Apr. 5, 2006, now Pat. No. 7,326,367.

(51) Int. Cl.
*B32B 18/00* (2006.01)
*H01K 3/22* (2006.01)
*H05K 1/09* (2006.01)
*C03B 29/00* (2006.01)

(52) U.S. Cl. .............. 156/89.12; 29/851; 174/257; 428/210

(58) Field of Classification Search ............ 501/26; 428/210; 29/851; 174/257; 156/89.12
See application file for complete search history.

(56) References Cited

U.S. PATENT DOCUMENTS

| | | |
|---|---|---|
| 4,215,170 A | 7/1980 | Oliva |
| 4,381,945 A | 5/1983 | Nair et al. |
| 4,654,095 A | 3/1987 | Steinberg |
| 4,663,240 A | 5/1987 | Hajdu et al. |
| 4,940,849 A | 7/1990 | Morris et al. |
| 5,002,826 A | 3/1991 | Pollart et al. |
| 5,021,293 A | 6/1991 | Huang et al. |
| 5,175,031 A | 12/1992 | Ochocki |
| 5,225,287 A | 7/1993 | Perry et al. |
| 5,250,394 A | 10/1993 | Wei et al. |
| 5,254,191 A | 10/1993 | Mikeska et al. |
| 5,378,408 A | 1/1995 | Carroll et al. |
| 5,439,852 A * | 8/1995 | Hormadaly .............. 501/26 |
| 5,744,232 A | 4/1998 | Bailey et al. |
| 5,753,571 A | 5/1998 | Donohue et al. |
| 2003/0096692 A1 | 5/2003 | Wang et al. |
| 2003/0100146 A1* | 5/2003 | Nakano et al. ........... 438/118 |

FOREIGN PATENT DOCUMENTS

| | | |
|---|---|---|
| EP | 0 045 482 A | 2/1982 |
| EP | 0 718 855 A | 6/1996 |
| EP | 1 534 053 A | 5/2005 |

* cited by examiner

*Primary Examiner*—Mark A Osele
*Assistant Examiner*—Nickolas Harm

(57) ABSTRACT

This invention is related to thick film conductor compositions comprising electrically conductive gold powder, one or more glass frit or ceramic oxide compositions and an organic vehicle. It is further directed to the composition's uses for LTCC (low temperature co-fired ceramic) tape, for fabrication of multilayer electronic circuits and in high frequency microelectronic applications.

12 Claims, No Drawings

THICK FILM CONDUCTOR PASTE COMPOSITION FOR LTCC TAPE IN MICROWAVE APPLICATIONS

FIELD OF THE INVENTION

This invention is related to thick film conductor compositions for use on LTCC (low temperature co-fired ceramic) tape and for fabrication of multilayer electronic circuits. It is further directed to the compositions use in high frequency microelectronic applications.

BACKGROUND OF THE INVENTION

An interconnect circuit board of an LTCC design is a physical realization of electronic circuits or subsystems made from a number of extremely small circuit elements that are electrically and mechanically interconnected. It is frequently desirable to combine these diverse electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Use of a Low Temperature Cofired Ceramic (LTCC) multilayer structure allows a circuit to be more compact than traditional alumina substrates by allowing vertical integration.

LTCC tape has been used in prior art high frequency microwave applications, such as telecommunications, automotive or military applications including radar, for its multilayer, cofiring and flexible design capabilities. Many properties are required of the conductors used in the fabrication of multilayer circuits for microwave applications, including desired resistivity, solderability, solder leach resistance, wire bondability, adhesion, migration resistance, and long term stability. Additionally, manufacturers are now seeking thick film conductor compositions for use in high frequency microwave applications wherein the compositions minimize lead and cadmium content in the circuits to meet environmental concerns.

U.S. Pat. No. 5,744,232 to Bailey discloses a thick film metallization compatible with LTCC that display very low microwave insertion losses commensurate with those of thin film gold. The electrical performance of the metallization is attained by using a spherical metal particle shape and uniform particle size distribution in the thick film paste. Bailey does not disclose the use of a lead free, cadmium free thick film conductor.

Furthermore, some prior art thick film conductor compositions used in high frequency applications have been known to require a "double print" (i.e., more than one application of the conductor composition on the substrate) to meet the desired properties of the system, in particular, to meet satisfactory wire bond acceptance and adhesion properties.

It is especially difficult to maintain the desired thick film conductor properties while minimizing or eliminating lead and cadmium. The present inventors provided such a lead free and cadmium free conductor that simultaneously maintains the desired thick film conductor properties and requires only one application of the thick film on the substrate to meet wire bonding requirements.

SUMMARY OF THE INVENTION

The invention is directed to a thick film composition comprising: (a) an electrically conductive gold powder; (b) one or more glass frit or ceramic oxide compositions wherein said glass frit and oxides do not contain lead or cadmium; and (c) an organic vehicle.

The invention is further directed to a method of forming a multilayer circuit comprising: (a) forming a patterned array of vias in a plurality of layers of green tape; (b) filling the vias in the green tape layer(s) of step (a) with a thick film composition; (c) printing of any of several thick film functional compositions over the surface of the via filled green tape layers of step (b)—including, but not limited to, the use of the present invention; (d) printing at least one patterned layer of any thick film composition, including, but not limited to, the present invention, over the outermost surface of the green tape layers of step (c); (e) laminating the printed green tape layers of step (d) and any blank layers deemed necessary to form an assemblage comprising a plurality of unfired functional and non-functional layers separated by unfired green tape; and (f) cofiring the assemblage of step (e).

DETAILED DESCRIPTION OF INVENTION

The composition(s) and multilayer circuit(s) of the present invention are particularly useful in microwave applications. "Microwave applications" are defined herein as applications which require a frequency in the range of 300 MHz to 300 GHz ($3\times10^8$ to $3\times10^{11}$ Hz). Furthermore, the present invention is useful in high frequency applications such as transmit/receive modules and radar applications. Still further, the composition(s) of the present invention are useful in the formation of microwave circuit components including, but not limited to: antenna, filters, baluns, beam former, I/O's, couplers, feedthroughs (via or EM coupled), wirebond connection, and transmission lines.

The main components of the thick film conductor composition(s) of the present invention are electrically conductive metal powders and one or more inorganic binders selected from (1) glass frits, (2) transition metal oxides, (3) precursors to transition metal oxides, and (4) mixtures thereof, dispersed in an organic medium. The components are discussed herein below.

I. Inorganic Components

The inorganic components of the present invention comprise (1) electrically conductive metal powders and (2) inorganic binders selected from one or more glass frits, transition metal oxides, precursors to transition metal oxides, and mixtures thereof. Additional optional inorganic phases may be added to the composition as necessary to meet the desired properties of the particular application.

A. Electrically Functional Powder—Electrically Conductive Gold Powder

Generally, a thick film composition comprises a functional phase that imparts appropriate electrically functional properties to the composition. The functional phase comprises electrically functional powders dispersed in an organic medium that acts as a carrier for the functional phase which forms the composition. The composition is fired to burn out the organic phase, activate the inorganic binder phase and to impart the electrically functional properties. Prior to firing, the printed parts are dried to remove volatile solvents. "Organics", "organic mediums" or "organic vehicles" are terms used to describe the polymer or resin components of a thick film composition, as well as solvents and small amounts of additional organic components, such as surfactants.

The electrically functional powders in the present thick film composition are conductive gold powder(s). The electrically functional powders may comprise elemental gold, mixtures of gold with small amounts of other metal powders (for example up to 3 weight percent based on total thick film composition of silver), and mixtures of gold powders, alloys, or compounds of several elements. The gold powder of the present invention is present in the amount of 50-95 weight percent total thick film composition.

The particle diameter and shape of the metal powder is not particularly important as long as it is appropriate to the application method. The electrically conductive gold powders of the present invention have a typical size of $D_{50}$ less than about 10 microns.

As noted above, metals in addition to the gold powder may be added to the thick film composition to meet the desired properties of the conductor application. For example, in one embodiment, silver (Ag) is used in amounts of less than 2 weight percent based on total thick film composition. Some embodiments comprise small amounts of Ag, typically in the range of 0-3 weight percent total composition.

Metal powders may be coated with surfactants well known in the art.

B. Inorganic Binders

Traditionally, conductive compositions have been based on lead or cadmium containing frits. The elimination of lead from glass compositions to meet current toxicity and environmental regulations may limit the types of binder that can be used to achieve the desired softening and flow characteristics, while simultaneously meeting wettability, thermal expansion, cosmetic and performance requirements.

The inorganic binders of the present invention are selected from one or more of (1) lead free and cadmium free glass frits, (2) transition metal oxides, (3) precursors to transition metal oxides, and (4) mixtures thereof.

The particle size of the frits and oxides is not narrowly critical and materials useful in the present invention will typically (although not limited to) have an average particle size from about 0.5 to about 6.0 μm, preferably from about 1 to about 4 μm.

It is preferred that the inorganic binder is a glass frit having a softening point of between about 350 and 800° C. in order that the compositions can be fired at the desired temperatures (typically 750-900° C., particularly 850° C.) to effect proper sintering, wetting and adhesion to the substrate, particularly a LTCC substrate. It is known that mixtures of high and low melting frits can be used to control the sintering characteristics of the conductive particles. One or more different glass frit compositions may be used in the present invention.

As used herein, the term "softening point" refers to softening temperatures obtained by the fiber elongation method of ASTM C338-57.

Examples of some useful glass compositions (compositions A to G) are given in Table 1 below; the oxide components are given in weight percent total glass composition.

TABLE 1

Glass Compositions (in weight percent total glass composition)

|  | A | B | C | D | E | F | G |
|---|---|---|---|---|---|---|---|
| $B_2O_3$ | 6.47 | 5.82 | 5.55 | 19.20 | 19.96 | 5.54 | 6.6 |
| $SiO_2$ | 2.42 | 1.06 | 1.01 | 43.20 | 15.27 | 1.19 | 1.2 |
| $Al_2O_3$ | 19.11 | 16.92 | 16.15 | 3.84 | 10.17 | 16.47 | 19.2 |
| $Na_2O$ | 9.32 | 3.39 | 7.52 | 7.88 | 8.90 | 0.04 | 9.5 |
| $Li_2O$ | 3.53 | 2.33 | 1.90 | 1.92 | 1.18 | 0.93 | 3.6 |
| P2O5 | 40.13 | 36.09 | 34.45 | 2.40 | 13.38 | 40.71 | 40.95 |
| NaF | 15.59 | 14.02 | 5 | 8.84 | 5.20 | 11.14 | 15.9 |
| CaO | 0.47 |  |  |  | 2.82 | 8.92 |  |
| $ZrO_2$ |  |  |  |  | 2.67 |  |  |
| ZnO |  | 17.70 | 15.53 | 7.20 | 18.40 | 12.94 |  |
| BaO |  |  |  |  | 1.07 |  |  |
| $ZnF_2$ |  |  | 10.33 |  |  |  |  |

As represented in Table 1, some glass compositions useful in the present invention are represented by the following composition, based on weight percent total glass composition: 5-20 $B_2O_3$, 1-44 $SiO_2$, 3-20 $Al_2O_3$, 0-10 $Na_2O$, 0-4 $Li_2O$, 2-41 $P_2O_5$, 5-16 NaF, 0-9 CaO, 0-3 $ZrO_3$, 0-19 ZnO, 0-2 BaO, and 0-11 $ZnF_2$. In one embodiment, the glass frit of the preceding composition is present in the thick film composition in the range of 0-3.0 weight percent total thick film composition.

Some other lead-free and cadmium-free glass frits useful in the present invention include alkali borosilicate-based and bismuth borosilicate-based frits.

The glass binders (glass frits) are prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. The peak temperature is generally in the range 1100° C.-1500° C., usually 1200° C.-1400° C. The melt is then quenched by cooling the melt, typically by pouring onto a cold belt or into cold running water. Particle size reduction can then be accomplished by milling as desired.

Other transition metal oxides may also be employed as all or part of the inorganic binder. Oxides or oxide precursors of zinc, cobalt, copper, nickel, rhodium, ruthenium, titanium, manganese and iron are useful in the present invention. These additives improve adhesion as measured by wire bonding or soldering.

Transition metal oxides can also be formed in situ through the addition of precursor compounds. These precursors can be in the form of organometallic compounds, carbonates, or frits. Reactions between oxides, frits and any precursor materials that occur upon firing can form either glasses or oxides which aid binding of the functional metal layer to the substrate. In one embodiment, the thick film composition of the present invention comprises copper oxide or a precursor of copper oxide. As noted above, the metal oxides present in the thick film composition could be directly in the form of an oxide or converted from metal-containing compounds under firing conditions. For example, copper oxide may be present or elemental copper, organo coppers, or crystallization products from a frit which form copper oxide. Other transition metal oxides and their precursors are also useful in the present invention. For example, the following oxides and their precursors are useful in the present invention: TiO2, $Co_3O_4$, $RuO_2$, $Fe_2O_3$, $SnO_2$, $ZrO_2$, $Sb_2O_3$, $MnO_x$, $CuO_x$, as well as other oxides.

The transition metal oxides, their precursors or mixtures thereof are present in the range of 0-3 weight percent total thick film composition. The glass frit, transition metal oxide, precursors of transition metal oxide and mixtures thereof are present in the total thick film composition in up to 3 weight percent. In one embodiment, copper oxide is present in the total composition in less than 2.0 wt. %. In a further embodiment, the copper oxide is present in the range of about 0.1 to 1.0 weight percent of the total thick film composition. In a further embodiment, the copper oxide is present in the amount of about 0.2-0.6 weight percent of the total thick film composition.

Oxides aid adhesion by reacting with the glass and ceramic components of the substrate or the paste (thick film), thus forming reaction products in situ that bind the metal conductor layer to the substrates.

C. Organic Medium

The inorganic components are typically dispersed into an organic medium by mechanical mixing to form viscous compositions called "pastes" having suitable consistency and rheology for printing. A wide variety of inert liquids can be used as organic medium. The rheological properties of the medium must be such that they lend good application properties to the composition, including: stable dispersion of solids, appropriate viscosity and thixotropy for screen printing, acceptable unfired "green" strength, appropriate wettability of the substrate and the paste solids, a good drying rate, and good firing and burn out properties. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The ratio of organic medium in the thick film composition to the inorganic components in the dispersion is dependent on the method of applying the paste and the kind of organic medium used, and it can vary. Usually, the dispersion will contain 50-95 wt % of inorganic components and 5-50 wt % of organic medium (vehicle) in order to obtain good coating.

APPLICATION

The conductor composition of the present invention may be used in conjunction with uncured ceramic material, such as Green Tape™ Low Temperature Cofired Ceramic (LTCC), and various other paste components, to form a multilayer electronic circuit. Green Tape™ is typically used as a dielectric or insulating material for multilayer electronic circuits. A sheet of Green Tape™ is blanked with registration holes in each corner to a size somewhat larger than the actual dimensions of the circuit. To electrically connect various layers of the multilayer circuit, via holes are formed in the Green Tape™. This is typically done by mechanical punching, however, any suitable method may be utilized. For example, a sharply focused laser can be used to volatilize and form via holes in the Green Tape™.

The interconnections between layers are formed by filling the vias with a thick film conductive composition (via-fill composition). In the case of this invention, a thick film conductive composition different to that disclosed herein is typically utilized as a via-fill composition. This conductive via-fill composition is usually applied by standard screen printing techniques, however, any suitable application technique may be employed. Each layer of circuitry is typically completed by screen printing conductor tracks. These tracks can be of the present invention, of other suitable conductor compositions, or a combination thereof. Also, resistor inks or high dielectric constant inks can be printed on selected layer(s) to form resistive or capacitive circuit elements. Conductors, resistors, capacitors and any other components are typically formed by conventional screen printing techniques.

The conductor composition of the present invention may be printed on the outermost layers of the circuit, either before or after lamination. Additionally, the conductor composition of the present invention may be used on one or more of the inner layers of the circuit, as well. Typically, the conductor composition of the present invention is not used as a via fill composition. It is understood by those skilled in the art that the circuit may comprise "blank layers" or layers of dielectric or insulating material on which no functional conductive, resistive, or capacitive layers are deposited. The outermost layers of the circuit are used to attach components. Components are typically wire-bonded, glued or soldered to the surface of fired parts. In the case of a wire-bonded component, the conductor composition of the present invention is particularly useful as it has superior wire-bondability properties over prior art compositions.

After each layer of the circuit is completed, the individual layers are collated and laminated. A confined uniaxial or isostatic pressing die is typically used to ensure precise alignment between layers. The assemblies are trimmed to an appropriate size either after lamination or after firing. Firing is typically carried out in a conveyor belt furnace or in a box furnace with a programmed heating cycle. The tape may be either constrained or free sintered during the firing process. For example, the methods disclosed in U.S. Pat. No. 4,654,095 to Steinberg and U.S. Pat. No. 5,254,191 to Mikeska may be utilized, as well as others known to those skilled in the art.

As used herein, the term "firing" means heating the assembly in an oxidizing atmosphere, such as air, to a temperature, and for a time sufficient to volatilize (burn-out) the organic material in the layers of the assemblage and allow reaction and sintering of the inorganic components of both the tape and conductors. "Firing" causes the inorganic components in the layers, to react or sinter, and thus densify the entire assembly, thus forming a fired article. This fired article may be a multilayered circuit used in telecommunications, military or automotive applications (such as automotive position sensors, radar, transmit receive modules, antennas etc).

The term "functional layer" refers to the printed Green Tape™, which has conductive, resistive, capacitive or dielectric functionality. Thus, as indicated above, a typical Green Tape™ layer may have contain one or more conductive traces, conductive vias, resistors and/or capacitors.

EXAMPLES

The invention will now be described in further detail with practical examples (Examples A-G). In these examples, the thick film paste components and their percentages are listed in Table 2.

The thick film pastes of Examples A-G were formed according to the following methodology.

All ingredients were thoroughly mixed in a mixer on a three roll mill or both in order to achieve appropriate dispersion. Once the metals and oxides were suitably dispersed, the paste was formulated to the proper solids and viscosity levels through the addition of solvent or resin containing organic vehicle. Viscosity was chosen (here 150-500 PaS) to be able to print conductor lines using standard screen printing equipment and techniques. The solids level was also chosen for good screen printability, as well as for optimal functional performance (adhesion, resistivity, electrical contact, etc).

Test Procedures used in Examples
  Wirebonding:

Parts were patterned in a manner which provided 150 and 300 μm bonding fingers and larger bonding pads. These patterned parts were cofired and bonded using 25 and 50 μm gold wire using a Hughes 2460 or K&S 4124 bonder respectively. During testing, bonds were placed at the center of the bond finger as well as close to the edge of the bond finger. This was done to observe any tendency for metallization lifting during either bonding or bond pull testing.

Bonds were pulled using a Dage Series 4000 bond tester. Observations were made regarding both the strength of the bond and the failure mode of the pull. Failure modes were categorized in six ways:

| | |
|---|---|
| 0 | Metal - substrate separation under the ball |
| 1 | Bond - metal separation at the ball |
| 2 | Break at top of ball |
| 3 | Wire break |
| 4 | Break at bond heel |
| 5 | Bond - metal separation at the heel |
| 6 | Metal - substrate separation under the heel |

Optimally, only type 2, 3 or 4 bond failures are observed. Any separation of the metal from the substrate (type 0,6) indicated an adhesion issue. Any separation of the bond from the metallization indicated an issue with bondability or bond acceptance. Examples A-F indicate that no type 0,1,5 or 6 failure modes were observed.

Another test of the bond acceptance included bonding multiple 25 μm wires to the metallization. Good bond acceptance was defined as no misses or other errors during the bonding. In the examples cited here, approximately 1920 bonds were formed and 75-100 were pulled for adhesion values.

TABLE 2

| Ingredients (wt %) | A | B | C | D Double print | E | F |
|---|---|---|---|---|---|---|
| Au | 83.9 | 83.9 | 83 | | 83 | 84 |
| Ag | 1 | 1 | | | 1 | 1 |
| Frit* | 0.8 | 0.5 | | | 1 | 0.8 |
| CuOx | 0.2 | 0.5 | 0.1 | | 0.3 | 0.1 |
| CdO | 0 | 0 | 0.5 | | 0 | 0 |
| Bi2O3 | 0 | 0 | 1 | | 0 | 0 |
| Rhodium complex | 0.4 | 0.4 | 0.5 | | 0.4 | 0.3 |
| Organic** | 13.7 | 13.7 | 14.9 | | 14.3 | 13.8 |

TABLE 2-continued

| Ingredients (wt %) | A | B | C | D Double print | E | F |
|---|---|---|---|---|---|---|
| | Cosmetic | | | | | |
| Fired Appearance | NG | OK | OK | NT | NT | NT |
| Refire Appearance | OK | OK | OK | OK | OK | OK |
| | 1 mil Au - 100 pulls | | | | | |
| Mean | 13.2 | 13.0 | 13.0 | 12.9 | 13.1 | 12.5 |
| Std Dev | 0.7 | 0.6 | 0.6 | 0.6 | 0.9 | 0.6 |
| 0, 1, 5, 6 | 0 | 0 | 0 | 0 | 0 | |
| Misses/1920 bonds | 0 | 0 | 0 | 0 | 0 | |
| | 2 mil Au, edge - 75 pulls | | | | | |
| Mean | 42.5 | 43.3 | 41.9 | 42.1 | NT | |
| Std Dev | 1.7 | 1.7 | 1.8 | 2.1 | | |
| 0, 1, 5, 6 | 0 | 0 | 0 | 0 | | |
| | 2 mil Au, center bond - 75 pulls | | | | | |
| Mean | 43.7 | 43.4 | 42.9 | 42.0 | 40 | 42 |
| Std Dev | 2.9 | 2.1 | 1.9 | 2.2 | 2.1 | 1.8 |
| 0, 1, 5, 6 | 0 | 0 | 0 | 0 | | |

*The frit used in Examples A, B, E, and F is represented by Frit G in Table 1.
**The organic vehicle for this composition included ethyl cellulose, soya lecithin and a phenolic resin dispersed in a mixture of texanol, dielthyleneglycol dibutylether, dimethylphthalate, dibutylphthalate, glycol ether and pine oil.

What is claimed is:

1. A method of forming a multilayer circuit comprising:
    a) forming a patterned array of vias in a plurality of layers of green tape;
    b) filling the vias in the green tape layer(s) of step a) with a thick film composition;
    c) printing patterned thick film functional layers over a surface of any or all of the via-filled green tape layers of step b);
    d) printing patterned layers of a thick film conductive composition over the outermost surface of the green tape layers of step c), the thick film conductive composition comprising:
        i) gold powder;
        ii) an inorganic binder of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition; and
        iii) organic medium;
    e) laminating the printed green tape layers of step d) to form an assemblage comprising a plurality of unfired interconnected functional layers separated by unfired green tape; and
    f) cofiring the assemblage of step e).

2. The method of claim 1 wherein said thick film functional layer of step c) is a thick film conductive composition for use in microwave applications comprising:
    i) gold powder;
    ii) an inorganic binders of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition; and
    iii) organic medium.

3. A method of forming a multilayer circuit comprising:
a) forming a patterned array of vias in a plurality of layers of green tape;
b) filling the vias in the green tape layer(s) of step a) with a thick film composition;
c) printing patterned thick film functional layers over a surface of some or all of the via-filled green tape layers of step b);
d) laminating the printed green tape layers of step c) to form an assemblage comprising a plurality of unfired interconnected functional layers separated by unfired green tape;
e) printing at least one patterned layer of a thick film conductive composition over the assemblage of step d), the thick film conductive composition comprising:
    i) gold powder;
    ii) an inorganic binders of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition; and
    iii) organic medium; and
f) cofiring the assemblage and patterned layer(s) of step e).

4. The method of claim 3 wherein said thick film functional layer of step c) is a thick film conductive composition for use in microwave applications comprising:
    i) gold powder;
    ii) an inorganic binders of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition; and
    iii) organic medium.

5. A multilayer circuit formed by the method of any one of claims 1 or 3.

6. A multilayer circuit comprising a thick film conductive composition, the thick film conductive composition comprising:
    i) gold powder;
    ii) an inorganic binders of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition; and
    iii) organic medium,
    wherein the composition has been processed to remove said organic medium and sinter said inorganic binder.

7. The method of claim 1, said thick film conductive composition of step d) further comprising:
    iv) one or more additional inorganic binders selected from the group consisting of transition metal oxides, precursors of transition metal oxides, and mixtures thereof, wherein said one or more additional inorganic binders are lead free and cadmium free.

8. The method of claim 7, wherein said thick film functional layer of step c) is a thick film conductive composition for use in microwave applications comprising:
    i) gold powder;
    ii) an inorganic binder of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition;
    iii) organic medium; and
    iv) one or more additional inorganic binders selected from the group consisting of transition metal oxides, precursors of transition metal oxides, and mixtures thereof, wherein said one or more additional inorganic binders are lead free and cadmium free.

9. The method of claim 3, said thick film conductive composition of step d) further comprising:
    iv) one or more additional inorganic binders selected from the group consisting of transition metal oxides, precursors of transition metal oxides, and mixtures thereof, wherein said one or more additional inorganic binders are lead free and cadmium free.

10. The method of claim 9, wherein said thick film functional layer of step c) is a thick film conductive composition for use in microwave applications comprising:
    i) gold powder;
    ii) an inorganic binder of glass frit consisting of 5-20 wt % $B_2O_3$, 1-44 wt % $SiO_2$, 3-20 wt % $Al_2O_3$, 0-10 wt % $Na_2O$, 0-4 wt % $Li_2O$, 2-41 wt % $P_2O_5$, 5-16 wt % NaF, 0-9 wt % CaO, 0-3 wt % $ZrO_3$, 0-19 wt % ZnO, 0-2 wt % BaO, and 0-11 wt % $ZnF_2$, wherein the weight percent are based on the total glass composition;
    iii) organic medium; and
    iv) one or more additional inorganic binders selected from the group consisting of transition metal oxides, precursors of transition metal oxides, and mixtures thereof, wherein said one or more additional inorganic binders are lead free and cadmium free.

11. A multilayer circuit formed by the method of claim 7 or claim 9.

12. The multilayer circuit of claim 6, said thick film conductive composition further comprising:
    iv) one or more additional inorganic binders selected from the group consisting of transition metal oxides, precursors of transition metal oxides, and mixtures thereof, wherein said one or more additional inorganic binders are lead free and cadmium free.

* * * * *